(12) United States Patent
Yeh

(10) Patent No.: US 6,924,635 B2
(45) Date of Patent: Aug. 2, 2005

(54) IC TESTER FOR PREVENTING DAMAGE FROM ELECTROSTATIC DISCHARGE AND OPERATION METHOD THEREOF

(75) Inventor: Cheng-Huang Yeh, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 293 days.

(21) Appl. No.: 10/249,083

(22) Filed: Mar. 14, 2003

(65) Prior Publication Data

US 2004/0178786 A1 Sep. 16, 2004

(51) Int. Cl.$^7$ .................................................. G01R 31/00
(52) U.S. Cl. ................................................... 324/158.1
(58) Field of Search ......................... 324/73.1, 158.1, 324/760, 765, 1, 57; 361/212

(56) References Cited

U.S. PATENT DOCUMENTS 4,316,231 A * 2/1982 Michel ........................ 361/212
4,588,092 A * 5/1986 Moechnig et al. .......... 209/573
6,563,319 B1 * 5/2003 Kraz ........................... 324/458

* cited by examiner

Primary Examiner—Vinh P. Nguyen
(74) Attorney, Agent, or Firm—Winston Hsu

(57) ABSTRACT

An IC tester for preventing damage from electrostatic discharge (ESD) and operation method thereof. The IC tester contains a temperature control oven chamber, an oven door connected to the temperature control oven chamber, at least a pair of thermal-isolated bars situated on one side of the oven door, and an actuating bar situated in the oven door. The actuating bar is connected to the thermal-isolated bars for controlling the pair of thermal-isolated bars to open or close. Therefore a DUT board is capable of passing through the pair of thermal-isolated bars for being loaded on the oven door and for not rubbing against the thermal-isolated bars when the pair of thermal-isolated bars is open so as to avoid ESD.

17 Claims, 5 Drawing Sheets

IC TESTER FOR PREVENTING DAMAGE FROM ELECTROSTATIC DISCHARGE AND OPERATION METHOD THEREOF

BACKGROUND OF INVENTION

1. Field of the Invention

The invention relates to an IC tester and operation method thereof, and more particularly, to an IC tester for preventing damage to a device-under-test, DUT, from electrostatic discharge (ESD) and operation method thereof, wherein the IC tester refers to any commercial reliability analyzer.

2. Description of the Prior Art

For the process of manufacturing IC chips, the reliability of products is a very important factor. Reliability is defined as the lifetime of a product under normal conditions. The IC chip makers need to know the lifetime of products in a short time, so an accelerated lifetime test is used to forecast the average lifetime. The theorem of the accelerated lifetime test is to test the lifetime of products in a harsh condition, such as with high temperature or great pressure environment, high voltage, or high current; then use the lifetime model to calculate real lifetime under normal conditions. Typical reliability tests are divided into wafer-level reliability (WLR) tests and package-level reliability (PLR) tests. The WLR test means to test the wafer directly on a tester in a production line. The PLR test means to segment and package a wafer as devices-under-test (DUT), and to insert those devices-under-test into a DUT board to test in a high temperature oven. The stress condition of the PLR test is closer to normal conditions of products, and the test result is widely accepted by manufactures.

A typical IC PLR tester is illustrated in FIG. 1, which is a schematic diagram of an IC tester 10 according to the prior art. The IC tester 10 contains a temperature control oven chamber 12 and one or two layers of heat-resistance material 20, such as rubber. The thermal-isolated material 20 is fixed in the oven door 14 and cannot be moved for isolating a temperature of the temperature control oven chamber 12. The heat-resistance material 20 has a plurality of sliced crevices 22, therefore a plurality of DUT boards 18 can pass through the sliced crevices 22 to load on the oven door 14. An IC tester 10 according to the prior art usually further contains an assemblage of circuit contacts (not shown in FIG. 1) positioned outside of the oven door 14 for connecting test circuits to perform electric property tests. Steps of executing the IC test according to the prior art include inserting devices-under-test 16 into sockets 26 on the DUT boards 18, loading the DUT boards 18 on the oven door 14 (please refer to FIG. 1), closing the oven door 14, and supplying current, voltage, and high temperature conditions with the temperature control oven to perform the test.

However, there is a vital disadvantage in that the IC tester 10 according to the prior art cannot prevent the damage of DUTs from electrostatic discharge (ESD). When an operator passes the DUT boards 18 through sliced crevices 22 of the thermal-isolated material 20 to load DUT boards 18, the bonding fingers 24 and the electricity-contacting area of the DUT boards 18 will rub against the thermal-isolated material 20 to create ESD, resulting in damage to the DUTs. This means the DUTs may be broken, and will lose regular functionality before the electric property test. Similarly, after performing the test, when the operation unloads the DUT boards 18 from oven door 14, the DUT boards 18 will also rub against the thermal-isolated material 20, creating ESD. The ESD will damage devices and cause huge costs.

The present remedy for a prior-art IC tester is to use specific fixtures provided by the prior-art IC tester maker. An operator needs to isolate the IC devices-under-test one by one with the specific fixtures when setting the devices-under-test into the sockets of the DUT boards. After loading the DUT boards on the oven door, the operator has to take off each specific fixture of every device-under-test for performing the IC test. When the IC test is finished, the operator also needs to isolate each device-under-test with the specific fixtures for unloading the DUT boards. Although the specific fixtures can avoid ESD, it costs too much time by putting on and taking off the specific fixtures. Furthermore, with the heavy and complicated steps of the remedy, negligence may be caused by the operator, resulting damage to the devices-under-test. Thus the purpose of decreasing the cost and improving the effects of the IC test is still not achieved. As a result, an IC tester for preventing damage from ESD with simple related operation method is badly needed by IC makers.

SUMMARY OF INVENTION

It is therefore a primary objective of the claimed invention to provide an IC tester for preventing damage from ESD and related operation method with simple steps to solve the above-mentioned problem. The IC tester refers to any commercial reliability analyzer.

According to the claimed invention, an IC tester for preventing damage from ESD is disclosed. The IC tester comprises a temperature control oven chamber, an oven door connected to the temperature control oven chamber, at least a pair of thermal-isolated bars situated on one side of the oven door for isolating a temperature of the temperature control oven chamber, and an actuating bar situated in the oven door. The actuating bar is connected to the thermal-isolated bars for controlling the pair of thermal-isolated bars to open or close. A DUT board is capable of passing through the pair of thermal-isolated bars for loading on the oven door and for not rubbing against the thermal-isolated bars when the pair of thermal-isolated bars is open so as to avoid ESD.

It is an advantage of the claimed invention that the claimed invention IC tester contains an actuating bar situated in the oven door for controlling the thermal-isolated bars to open by manual or automatic devices, and the operator can load the DUT boards while not rubbing against the thermal-isolated bars so that no ESD will occur. After loading the DUT boards, the operator can control the actuating bar again to close the thermal-isolated bars to perform electric property test. As a result, the claimed invention IC tester can avoid ESD effectively with a simple operating method to reduce performing time of the IC test and to raise the accuracy of the IC test.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
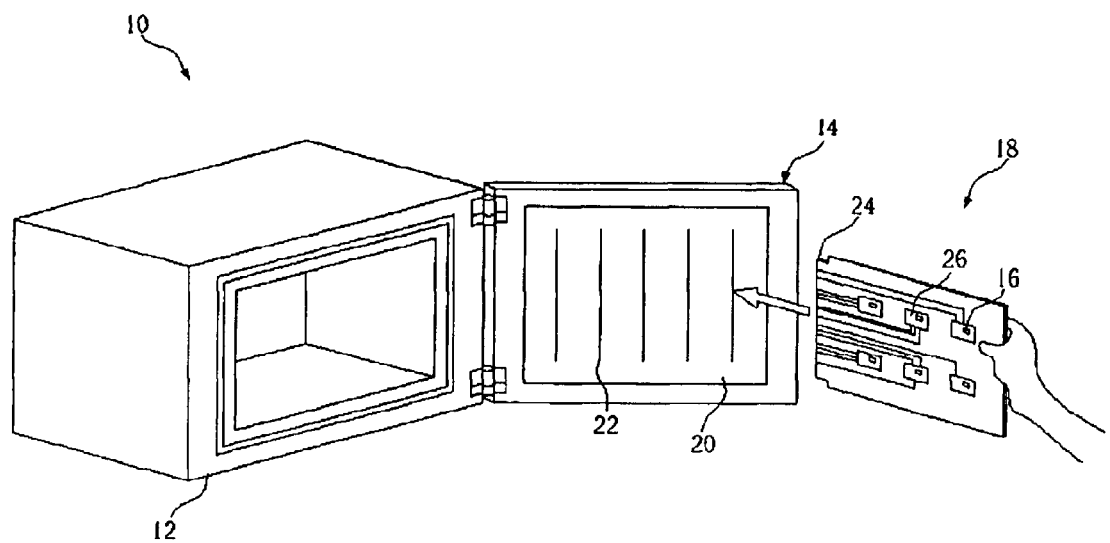
FIG. 1 is a schematic diagram of an IC tester according to the prior art.
Figure 2:
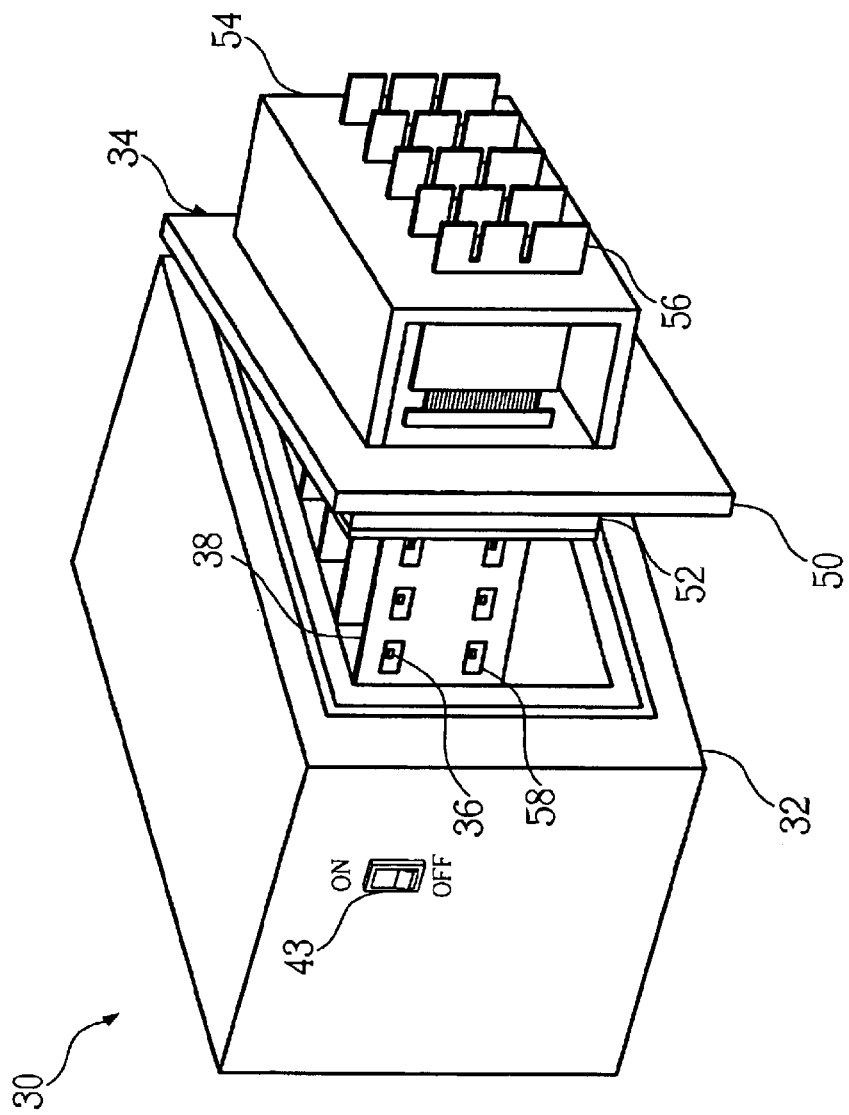
FIG. 2 is a schematic diagram of an IC tester according to a first embodiment of the present invention.
Figure 3:
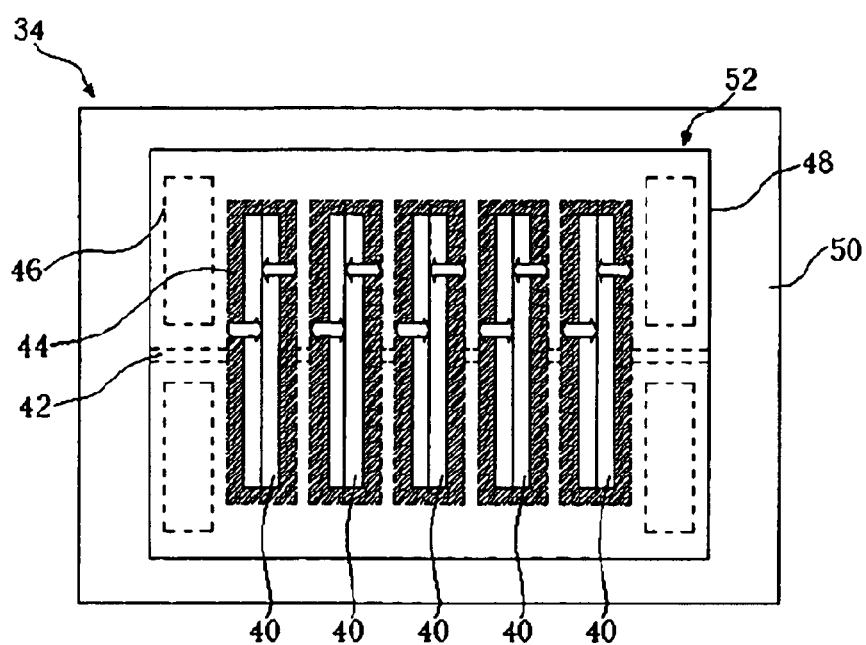
FIG. 3 is an inside view of an oven door of FIG. 2.

Please refer to FIG. 2 and FIG. 3. FIG. 2 is a schematic diagram of an IC tester 30 according to a first embodiment of the present invention; FIG. 3 is an inside view of an oven door 34 of FIG. 2. IC tester 30 contains a temperature control oven chamber 32, the oven door 34 connected to the temperature control oven chamber 32, a plurality of pairs of thermal-isolated bars 40 (only shown five pairs in FIG. 3) positioned inside of the oven door 34, and an actuating bar 42 positioned in the oven door 34. The thermal-isolated bars 40 can be composed of thermal resistance polymer material, for example, heat-resistance rubber. It should be noted that the present invention IC tester 30 contains, but is not limited to, a heating plate type and heat convection type oven. Since the heating type of an IC tester is not the characteristic technology of the present invention, any IC testers loading DUT boards on an oven door for performing the test are contained in the field of the present invention.

Please refer to FIG. 3. The oven door 34 is formed by three portions: an oven door base 50, an insulation box 52, and a jump board set structure 54. On the jump board set structure 54 are a plurality of jump boards 56, which can contact extra circuits to supply current and voltage when performing a test. The oven door base 50 contains a handle (not shown in FIG. 3) for opening or closing the oven door 34 conveniently. The insulation box 52 positioned on the inside of the oven door 34 is like a rectangular box. On the surface of the insulation box 52 is a metal plate 48, which contains five long openings (not shown) covered by the five pairs of thermal-isolated bars 40 respectively. The insulation box 52 further contains an actuating bar 42 and at least a layer of heat-insulation cotton 46. The actuating bar 42 is a driving bearing with five pairs of carriers 44. Each pair of carriers 44 is connected to each pair of thermal-isolated bars 40 respectively for carrying the thermal-isolated bars 40 to move horizontally when being opened or closed. In addition, the actuating bar 42 is connected to a switch 43 located outside of the temperature control oven chamber 32, as shown in FIG. 2. The switch can be an automatic button device, a manual draw rod device, or a remote-controlled device to control the actuating bar 42 for driving each pair of carriers 44 to open or close the thermal-isolated bars 40, wherein the driven procedure can be a motor-driven mode or a mechanical mode. For example, the actuating bar 42 may be a guide helical shaft with one or more gear wheels and rolling bands to drive the carriers 44. When each pair of the carriers 44 moves in an opposite direction, the carriers 44 will carry its connected thermal-isolated bars 40 to be horizontally open, and the long openings of the metal plate 48 will be exposed so that the DUT boards 38 containing devices-under-test 36 can pass through the long openings without rubbing against the metal plate 48 or the thermal-isolated bars 40. When each pair of carriers 44 is driven by the gear wheels and rolling bands to approach each other, each pair of thermal-isolated bars 40 will be carried by the carriers 44 to be close and clip the PUT boards 38 loading on the oven door 34 for insulating the temperature of the temperature control oven. The heat-insulation cotton 46 is used for increasing the temperature insulation of the temperature control oven and is fixed in he insulation box 52 by a plurality of screws. Similarly, the heat-insulation cotton 46 contains five sliced crevices (not shown) corresponding to the five long openings of the metal plate 48 respectively. The five sliced crevices is a little wider than a width of the DUT boards 38, thus the DUT boards 38 can pass through the sliced crevices without rubbing against the heat-insulation cotton 46 so as to avoid ESD.

The operation method of the present invention IC tester will be illustrated in the description below. An operator can operate the IC tester by following the steps below: opening the oven door 34, opening each pair of thermal-isolated bars 40 with the actuating bar 42 by the switch of the actuating bar 42, loading DUT boards 38 containing devices-under-test 36 on the oven door 34 by passing the DUT boards 38 through each pair of opened thermal-isolated bars 40, then closing each pair of thermal-isolated bars 40 with the actuating bar 42 by the switch of the actuating bar 42 to clip each DUT boards 38, closing the oven door 34, finally supplying voltage and current by the jump boards 56 on the jump board set structure 54 and performing the electric property test. The method of unloading DUT boards 38 is to open the oven door 34, open each pair of thermal-isolated bars 40 with the actuating bar 42, and pull out each DUT board 38. Then the operator can take out the devices-under-test 36 from the sockets 58 of the DUT boards 38.

Figure 4:
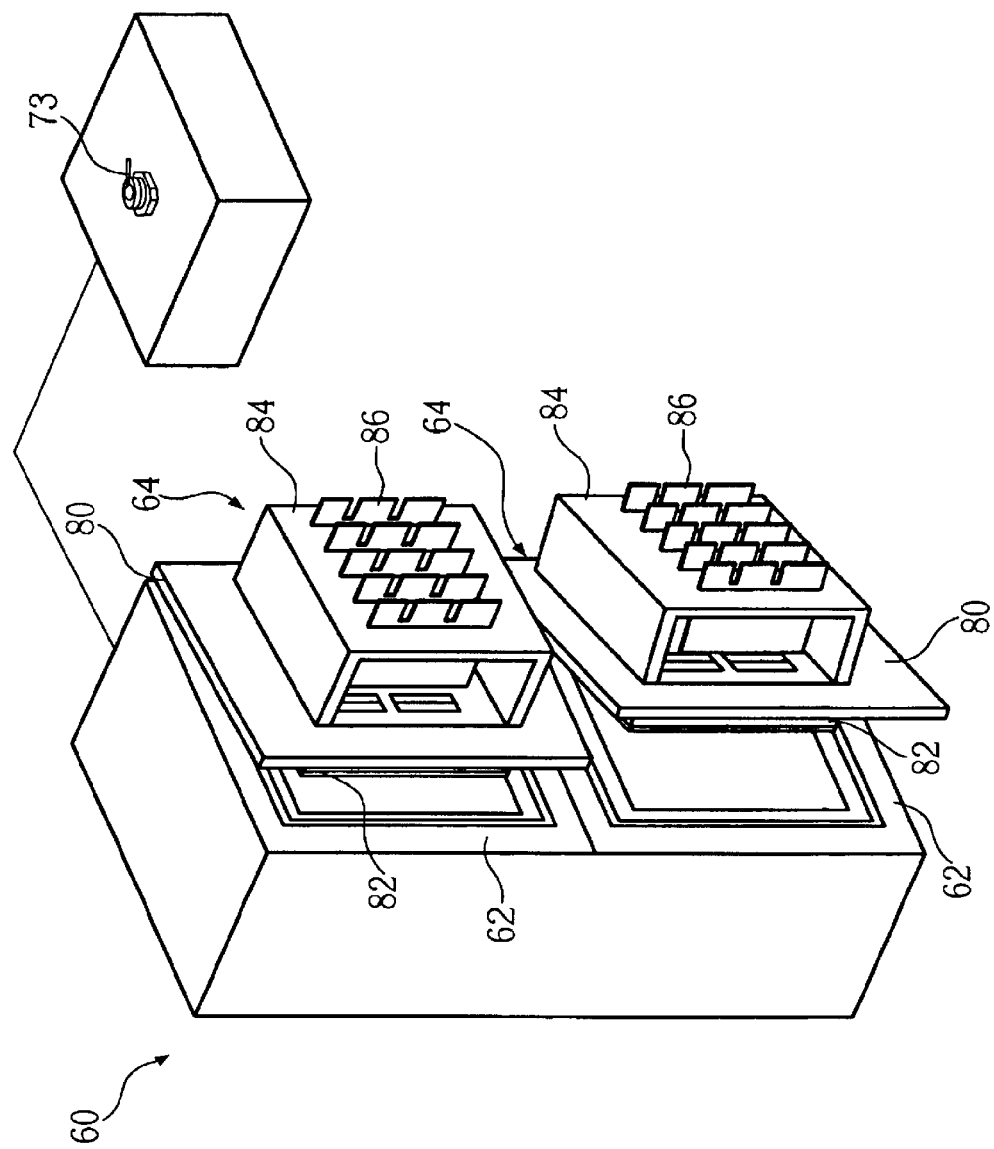
FIG. 4 is a schematic diagram of an IC tester according to a second embodiment of the present invention.
Figure 5:
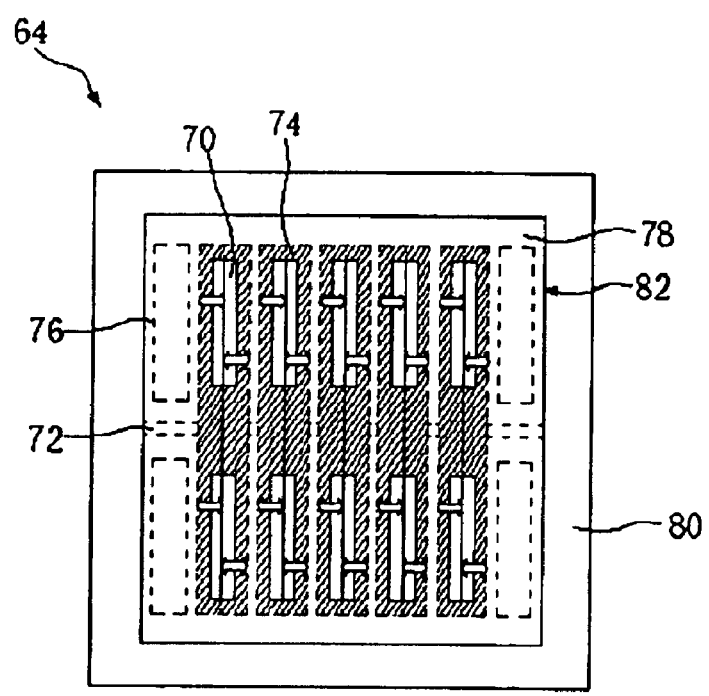
FIG. 5 is an inside view of an oven door of FIG. 4.

Please refer to FIG. 4 and FIG. 5. FIG. 4 is a schematic diagram of an IC tester 60 according to a second embodiment of the present invention, and FIG. 5 is an inside view of an oven door 64 of FIG. 4. The IC tester 60 contains two temperature control oven chambers 62 and two oven doors 64. Each oven door 64 has twenty pairs of thermal-isolated bars 70 and two actuating bars 72. As shown in FIG. 5, a heat-resistance metal plate 78, such as an iron plate, and ten pairs of thermal-isolated bars 70 are set on the surface of the insulation box 82. Each pair of thermal-isolated bars 70 is connected to the actuating bar 72 through a pair of carriers 74. The carriers 74 may be composed of heat-resistance metal, such as iron. The heat-resistance metal plate 78 has ten long openings (not shown in FIG. 5) positioned behind each pair of thermal-isolated bars 70 respectively. The actuating bar 72 is used for controlling each pair of thermal-isolated bars 70 to open or close. The other side of the insulation box 82 contains the same device as the inside of the insulation box 82. This means that the surface connecting to the oven door base 80 of the insulating box 82 also contains ten pairs of thermal-isolated bars 70 and an actuating bar 72, which is connected to thermal-isolated bars 70 through ten pairs of carriers 74. The two actuating bars 72 in the insulation box 72 are further connected to an automatic or a manual switch, such as a remotely manual draw rod device 73 depicted in FIG. 4, for controlling the two actuating bars 72 to make the twenty pairs of thermal-isolated bars 70 on the insulation box 82 open or close simultaneously. When a pair of thermal-isolated bars 70 is open, a DUT board (not shown) can be passed through the pair of opened thermal-isolated bars 70 and the long opening of the heat-resistance metal plate 78 to load on the oven door 64 without ESD damaging devices-under-test. Other heat-insulation material is permitted to fill in the insulation box 32 to increase the heat utility of the temperature control oven.

In this embodiment, each DUT board is clipped by two thermal-isolated bars 70 (with one outside and one inside the insulation box 82); therefore a preferable insulation effect is supplied. Furthermore, since the IC tester 60 contains two temperature control ovens with the content of ten DUT boards of each oven door 64, more devices-under-test can be tested in the same time to produce a superior average test result. In addition, the two temperature control ovens can supply different conditions, such as temperature, current, and voltage, simultaneously when performing the IC test, thus the IC tester 60 not only saves the equipment space of IC testers but also provides more selections of test conditions.

In contrast to the prior art, the present invention IC tester introduces an actuating bar for controlling the thermal-isolated bars to open or close so that an operator can load/unload the DUT boards without rubbing against the thermal-isolated bars through a simple operation method. Therefore the present invention IC tester can prevent damages from ESD effectively. In another respect, the DUT boards used in a prior-art IC tester are suitable for use in the present invention IC tester directly. Thus no revisions of DUT boards are needed. As a result, the present invention saves testing time, which causes great cost in the prior art, reduces the probability of damaging IC chips to a minimum, and further increases the accuracy of IC test results to aid the cost control of the IC manufacturer.

According to the materials and the temperature control oven used in the present invention IC tester, a temperature up to 350° C. is supplied to perform the electricity property test since 350° C. is the highest temperature of a typical reliability test. For different conditions of other IC tests, an IC tester providing various conditions can be produced according to the spirit of the present invention, such as an IC tester that supplies higher temperatures with different materials and heat generation.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An IC tester for preventing damage from electrostatic discharge (ESD), the IC tester comprising:
    a temperature control oven chamber;
    an over door connected to the temperature control oven chamber;
    at least a pair of thermal-isolated bars situated on one side of the oven door for isolating a temperature of the temperature control oven chamber; and
    an actuating bar situated in the oven door;
    wherein the actuating bar is connected to the thermal-isolated bars for controlling the pair of thermal-isolated bars to open or close, a DUT board being capable of passing through the pair of thermal-isolated bars for loading on the oven door and for not rubbing against the thermal-isolated bars when the pair of thermal-isolated bars is open so as to avoid ESD.

2. The IC tester of claim 1 wherein the thermal-isolated bars are composed of thermal resistance polymer material.

3. The IC tester of claim 1 further comprising a switch located outside of the temperature control oven chamber for controlling the pair of thermal-isolated bars to open or close.

4. The IC tester of claim 3 wherein the switch is an automatic button device.

5. The IC tester of claim 3 wherein the switch is a manual draw rod device.

6. The IC tester of claim 1 further comprising a layer of heat-insulation cotton in the oven door for isolating the temperature of the temperature control oven chamber, wherein the heat-insulation cotton contains at least a sliced crevice, the DUT board being capable of passing through the sliced crevice for loading on the oven door.

7. The IC tester of claim 1 wherein the sliced crevice of the heat-insulation cotton is wider than a width of the DUT board, and the DUT board will not rub against the heat-insulation cotton when the DUT board passes through the sliced crevice of the heat-insulation cotton so as to avoid ESD.

8. The IC tester of claim 1 wherein the IC tester is used to analyze the electric properties of a device-under-test.

9. An operating method of a IC tester for preventing damage from ESD, wherein the IC tester comprises a temperature control oven chamber, an over door connected to the temperature control oven chamber, at least two pairs of thermal-isolated bars situated on each side of the oven door for isolating a temperature of the temperature control oven chamber, a layer of heat-insulation cotton situated in the oven door for isolating the temperature of the temperature control oven chamber, and at least two actuating bars situated in the oven door for controlling each pair of thermal-isolated bars to open or close, the operating method comprising:
    opening each pair of thermal-isolated bars with the actuating bar;
    loading a DUT board containing devices-under-test onto the oven door by passing the DUT boards through each pair of opened thermal-isolated bars;
    closing each pair of thermal-isolated bars with the actuating bar;
    closing the oven door; and
    performing the test process.

10. The operating method of claim 9 further comprising:
    opening each pair of thermal-isolated bars with the actuating bar after the test process is finished; and
    unloading the DUT boards from the oven door.

11. The operating method of claim 9 wherein when the pairs of thermal-isolated bars are open, a DUT board is capable of passing through the pairs of thermal-isolated bars for being loaded on the oven door and for not rubbing against the thermal-isolated bars so as to avoid ESD.

12. The operating method of claim 9 wherein the thermal-isolated bars are formed by thermal resistance polymer material.

13. The operating method of claim 9 wherein the actuating bar is controlled by a switch located outside of the temperature control oven chamber for controlling the pairs of thermal-isolated bars to open or close.

14. The operating method of claim 13 wherein the switch is an automatic button device.

15. The operating method of claim 13 wherein the switch is a manual draw rod device.

16. The operating method of claim 9 wherein the heat-insulation cotton at least a sliced crevice, and the sliced crevice is wider than a width of the DUT board, the DUT board being capable of passing through the sliced crevice for loading on the oven door and for not rubbing against the heat-insulation cotton so as to avoid ESD.

17. The operating method of claim 9 wherein the IC tester is used to analyze electric properties of a device-under-test.

* * * * *